(12) United States Patent
Kathawala et al.

(10) Patent No.: US 9,153,596 B2
(45) Date of Patent: Oct. 6, 2015

(54) ADJACENT WORDLINE DISTURB REDUCTION USING BORON/INDIUM IMPLANT

(75) Inventors: Gulzar A. Kathawala, Santa Clara, CA (US); Zhizheng Liu, San Jose, CA (US); Kuo Tung Chang, Saratoga, CA (US); Lei Xue, Milpitas, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 968 days.

(21) Appl. No.: 12/390,550

(22) Filed: Feb. 23, 2009

(65) Prior Publication Data
US 2010/0213535 A1   Aug. 26, 2010

(51) Int. Cl.
*H01L 27/115*   (2006.01)
*G11C 16/10*   (2006.01)
*G11C 16/34*   (2006.01)

(52) U.S. Cl.
CPC .......... *H01L 27/11568* (2013.01); *G11C 16/10* (2013.01); *G11C 16/3418* (2013.01); *H01L 27/11521* (2013.01); *H01L 27/11551* (2013.01); *H01L 27/11578* (2013.01)

(58) Field of Classification Search
CPC ............ H01L 27/115; H01L 27/11568; H01L 21/76831; H01L 21/76834; H01L 21/76837; H01L 45/1683

USPC ........................................... 257/E29.309, 324
See application file for complete search history.

(56) References Cited

U.S. PATENT DOCUMENTS

| | | | |
|---|---|---|---|
| 6,958,272 B2* | 10/2005 | Lingunis et al. | 438/257 |
| 7,018,868 B1* | 3/2006 | Yang et al. | 438/110 |
| 7,316,941 B1* | 1/2008 | Gupta | 438/133 |
| 2002/0011608 A1* | 1/2002 | Lee | 257/200 |
| 2002/0182829 A1* | 12/2002 | Chen | 438/514 |
| 2004/0164359 A1* | 8/2004 | Iwata et al. | 257/379 |
| 2005/0239246 A1* | 10/2005 | Manning | 438/257 |
| 2007/0134867 A1* | 6/2007 | Sadd et al. | 438/201 |
| 2008/0023751 A1* | 1/2008 | Joshi et al. | 257/324 |
| 2008/0153274 A1* | 6/2008 | Thurgate et al. | 438/526 |

* cited by examiner

*Primary Examiner* — Wael Fahmy
*Assistant Examiner* — Sarah Salerno

(57) ABSTRACT

Semiconductor devices having reduced parasitic current and methods of malting the semiconductor devices are provided. Further provided are memory devices having reduced adjacent wordline disturb. The memory devices contain wordlines formed over a semiconductor substrate, wherein at least one wordline space is formed between the wordlines. Adjacent wordline disturb is reduced by implanting one or more of indium, boron, and a combination of boron and indium in the surface of the at least one wordline space.

20 Claims, 10 Drawing Sheets

ADJACENT WORDLINE DISTURB REDUCTION USING BORON/INDIUM IMPLANT

TECHNICAL FIELD

Described are semiconductor devices having reduced parasitic currents and memory devices having improved threshold voltage for wordlines adjacent to programmed cells.

BACKGROUND

Memory devices include random access memories (RAM) and read only memories (ROM). The categories of RAM and ROM memories further include subclasses of static RAM (SRAM), dynamic RAM (DRAM), programmable ROM (PROM), electrically programmable ROM (EPROM), electrically erasable PROM (EEPROM), FLASH memory, and the like. All the foregoing devices employ architecture in the form of an array of bit cells containing plural rows (wordlines) and plural intersection columns (bitlines).

Typically, the address of a memory cell is determined by the intersection of a wordline with a bitline. A particular cell is activated by activating its row through a wordline, which is connected to the control gate of the transistor forming that cell. The cell is then either read or programmed through a bitline.

The trend in semiconductor memory devices is toward higher circuit density with higher numbers of bit cells per device, lower operating voltages, and higher access speeds. To achieve these high densities there have been, and continue to be, efforts toward scaling down device dimensions. As device dimensions shrink, charged stored in memory cells creates undesirable capacitance issues with neighboring elements within the memory device. In particular, current flow in wordlines adjacent to programmed memory cells is often times disturbed resulting in a higher threshold voltage required to activate the row associated with the affected wordline. This phenomenon is referred to as adjacent wordline disturb (AWD). AWD is a particular concern with FLASH memory devices where the non-volatile nature of the device results in charge remaining in programmed cells for long durations of time.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides semiconductor devices having reduced parasitic currents in two or more conductive conduits. The conductive conduits may be formed from semiconductor material doped to allow passage of a current. The semiconductor devices contain two or more conductive conduits, a space formed between the conductive conduits and a charge storage layer capable of storing a charge, all formed over a semiconductor substrate. Boron, indium, or a combination of boron and indium is implanted into the space formed between the conductive conduits to facilitate reducing parasitic currents.

Another aspect of the subject invention provides memory semiconductor devices having reduced adjacent wordline disturb. The memory semiconductor devices contain a semiconductor substrate and an array of two or more memory cells. The memory cells contain a first and a second bitlines formed over the semiconductor substrate, a charge storage layer capable of storing a charge formed over the semiconductor substrate, and a first and a second wordlines formed over the charge storage layer and the semiconductor substrate, wherein the first and second wordlines form a wordline space. Boron, indium, or a combination of boron and indium is implanted into at least one wordline space.

Yet another aspect of the subject invention provides method for malting a semiconductor device having an array of memory cells and having an implant of one or more of boron, indium, and a combination of boron and indium implanted into the surface of at least one wordline space.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
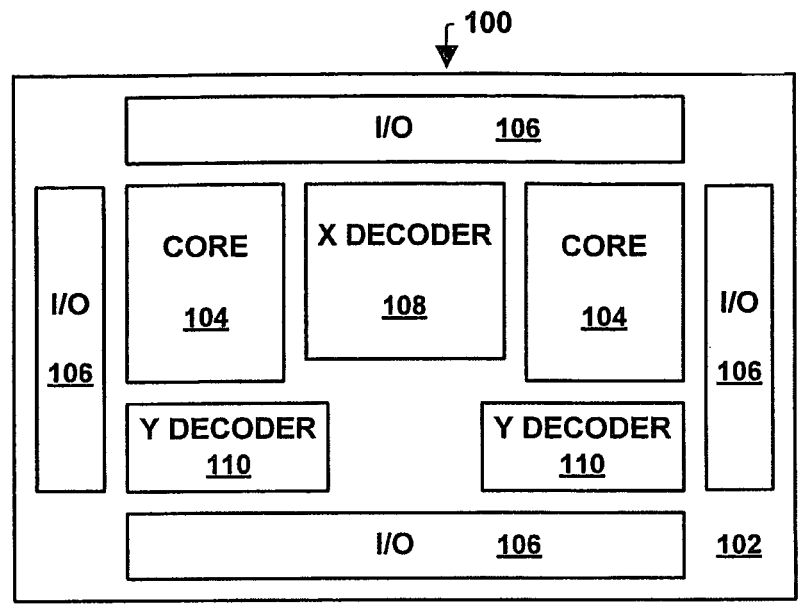
FIG. 1 is a top view of an exemplary memory device in accordance with an aspect of the subject invention.

As semiconductor devices shrink in size, stored charge, for example, in the charge storage layer of a non-volatile memory device or in a capacitor of a volatile memory device, is located in close enough proximity to adjacent and other nearby device elements for capacitance to have a significant detrimental effect. Specifically, stored charge can cause an undesirable reduction in the current flow in adjacent conductive conduits formed on a semiconductor substrate. This reduction in current is often accompanied by current flowing along the edge of conductive conduits and even into the space between conduits, rather than through the center of the conduit. Conductive conduits are any conductive structure formed of material deposited on or over a semiconductor substrate. Conductive conduits, include, but are not limited to, wordlines in memory devices and other conductive pathways formed from doped polysilicon.

The innovations disclosed herein are applicable to any semiconductor device for inhibiting parasitic currents created in conductive regions adjacent to stored charge. Many types of semiconductor devices include memory cells having stored charge. The innovations disclosed herein also apply to any type of non-volatile memory cells or device including dual poly flash memory cells and dielectric charge storage memory cells. This phenomenon is of particular concern in memory devices and memory cells. Memory cells are components of many integrated circuits including processors having on-board cache memory. Charge may be stored in a charge trapping dielectric material that forms a charge trapping layer in an array of memory cells, or charge may be stored in a capacitor in an array of memory cells.

In a traditional memory cell, the memory cells include a transistor having a source, a drain, and a gate. A memory cell in an unprogrammed, default state permits current to flow from the source to the drain upon application of a threshold voltage to the control gate via the appropriate wordline. Hence, a memory cell in an unprogrammed state is read as a value of 1. In most non-volatile memory cells, the cell is programmed by applying a relatively high programming voltage to a control gate and connecting the source to ground and a drain to a predetermined potential above the source. Then, hot electrons inject into a charge storage layer, between the control gate and the drain, and become trapped in the charge storage layer due to the insulated nature of the charge storage layer. As a result, the threshold voltage required to make the memory cell transistor conductive is increased and the standard activation or read voltage applied to the control gate fails to make the transistor conductive. Hence, the programmed cell is read as a value of 0.

Wordlines adjacent to programmed memory cells often exhibit a higher threshold voltage than wordlines adjacent to unprogrammed memory cells, especially as the size of memory cells decreases. The increase in threshold voltage in wordlines adjacent to programmed cells is referred to AWD. AWD is often accompanied by current flowing along the edge of wordlines and even into the wordline space in regions above areas of stored charge, rather than through the center of the wordlines. Those skilled in the art will understand that such reduction in current may require higher read voltages, misreading of the programming state of cells, as well as other undesirable effects.

The innovation described herein provides memory devices having decreased AWD due to disturb from charged/programmed memory cells. In a semiconductor device, boron, indium or a combination of boron and indium is implanted into the region between wordlines (wordline space) to reduce AWD or parasitic currents and/or to improve current flow.

In one embodiment of the invention, the width of the wordline spaces is about 10 μm or less. In another embodiment of the invention, the width of the wordline spaces is about 5 μm or less. In yet another embodiment of the invention, the width of the wordline spaces is about 1 μm or less. Those skilled in the art will readily understand that the potential of parasitic currents and AWD increases as wordlines becomes spaced closed together.

Any suitable ion implantation method known in the art may be used. In general, the lowest possible effective acceleration energy is used to achieve the desired effect. In one embodiment, the acceleration energy is from about 0.2 keV to about 10 keV. In another embodiment, the acceleration energy is from about 0.2 keV to about 100 keV. In yet another embodiment, the acceleration energy is from about 0.4 keV to about 500 keV. In one embodiment, the concentration of atoms deposited is from about $10^{16}$ to about $10^{19}$ atoms/cm$^3$. In another embodiment, the concentration of atoms deposited is from about $10^{17}$ to about $10^{18}$ atoms/cm$^3$. Dopants useful in the invention include boron and indium. Those skilled in the art will understand that dopants with higher atomic mass require increased acceleration energy.

The ions are implanted to a depth effective to reduce AWD and/or parasitic currents and/or improve current flow. In one embodiment, the projected range of the implanted atoms is from about 10 nm to about 200 nm. In another embodiment, the projected range of the implanted atoms is from about 20 nm to about 2000 nm. In yet another embodiment, the projected range of the implanted atoms is from about 50 nm to about 10000 nm. Those skilled in the art will understand that that dopant implant beam contains ionized dopants that revert to atomic form upon implantation.

In one embodiment of the invention, the semiconductor device is positioned such that the dopant implant beam strikes the semiconductor device in an about perpendicular fashion, where the ion implant beam is about parallel to a plane perpendicular to the surface of the semiconductor substrate. In another embodiment of the invention, the semiconductor device is positioned at a non-perpendicular angle relative to the ion implantation such that the dopant implant beam strikes the semiconductor device at a non-perpendicular angle (a tilt angle), where the ion implant beam is at a non-perpendicular angle relative to a plane perpendicular to the surface of the semiconductor substrate. In one embodiment, the tilt angle is greater than about 0 but less than about 30 degrees. In another embodiment, the tilt angle is greater than about 0 but less than about 15 degrees. In yet another embodiment, the tilt angle is greater than about 10 degrees but less than about 40 degrees.

In a typical semiconductor device, wordlines forming a memory array are space in regular and about equal intervals. In some semiconductor devices, there can be gaps in the regular interval to form regions where bitlines and/or wordlines interface with control circuitry. In one embodiment of the invention, dopant is deposited between within the wordline spaces between substantially all of the wordlines in the semiconductor device. In another embodiment of the invention, dopant is deposited between within the wordline spaces between substantially all of the wordlines that are regularly spaced in forming a memory array in the semiconductor device. In yet another embodiment of the invention, dopant is not deposited between within the wordline spaces representing gaps or breaks larger than the regular spacing of the wordlines forming a memory array. In still yet another embodiment of the invention, dopant is deposited within only a portion of the wordline spaces of the semiconductor device.

The innovation is now described with reference to the drawings, wherein like reference numerals are used to refer to like elements throughout. In the following description, for purposes of explanation, numerous specific details are set forth in order to provide a thorough understanding of the innovation. It may be evident, however, that the innovation can be practiced without these specific details. In other instances, well-known structures and devices are shown in block diagram form in order to facilitate describing the invention.

Although the solutions herein can be applied to any type of semiconductor device, the innovation is hereinafter illustrated in the context of an exemplary memory device and in particular a FLASH memory device. FIG. 1 illustrates a top view of an exemplary FLASH memory device 100. The memory device 100 generally includes a semiconductor substrate 102 in which one or more high-density core regions 104 and one or more lower-density peripheral regions are formed. The high-density core regions 104 typically include one or more M by N arrays of individually addressable, substantially identical memory cells. The lower-density peripheral regions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
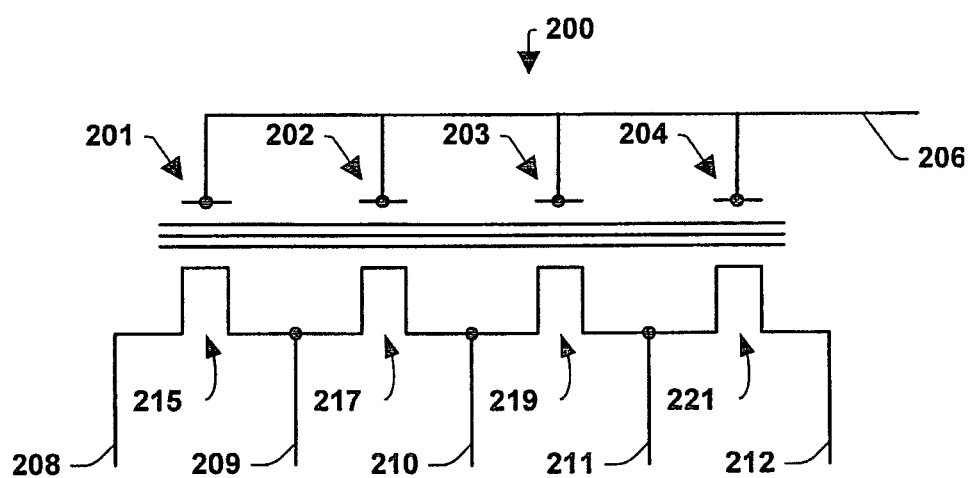
FIG. 2 is a schematic illustration of a portion of a memory core such as may include at least part of one of the cores depicted in FIG. 1 in a virtual ground type configuration in accordance with an aspect of the subject invention.

FIG. 2 is a schematic illustration of a portion 200 of an exemplary memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a word line 206, which serves as a control gate, and pairs of the memory cells share a common bit line. For instance, in the example shown, the memory cell 201 associates bit lines 208 and 209; the memory cell 202 associates bit lines 209 and 210; the memory cell 203 associates bit lines 210 and 211; and the memory cell 204 associates bit lines 211 and 212. As such, cells 201 and 202 share bit line 209, cells 202 and 203 share bit line 210 and cells 203 and 204 share bit line 211, respectively.

Depending upon a signal on the word line and the connection of the bit lines in a memory cell to an electrical source or drain, the memory cells 201 through 204 are capable of writing, reading, and erasing bits at locations 215 through 221. For example, control of the bit at location 215 is achieved through connection of the drain to the bit line 208 and the source to the bit line 209. Similarly, control of the bit at location 217 is achieved through connection of the drain to the bit line 209 and the source to the bit line 210. It will be appreciated that although adjacent memory cells share common bit lines, the adjacent memory cells do not interfere with each other because the memory cells are typically programmed one at a time and in such instances only one memory cell is active at a time while programming.

Terms, such as "on," "above," "below," and "over," used herein, are defined with respect to the plane defined by a semiconductor substrate. The terms "on," "above," "over," ect. are used herein to indicate that one element is farther away from the plane of the semiconductor substrate than another reference element. The term "below" and similar terms indicate that the subject element is closer to the plane of the semiconductor substrate than another reference element.

Figure 3:
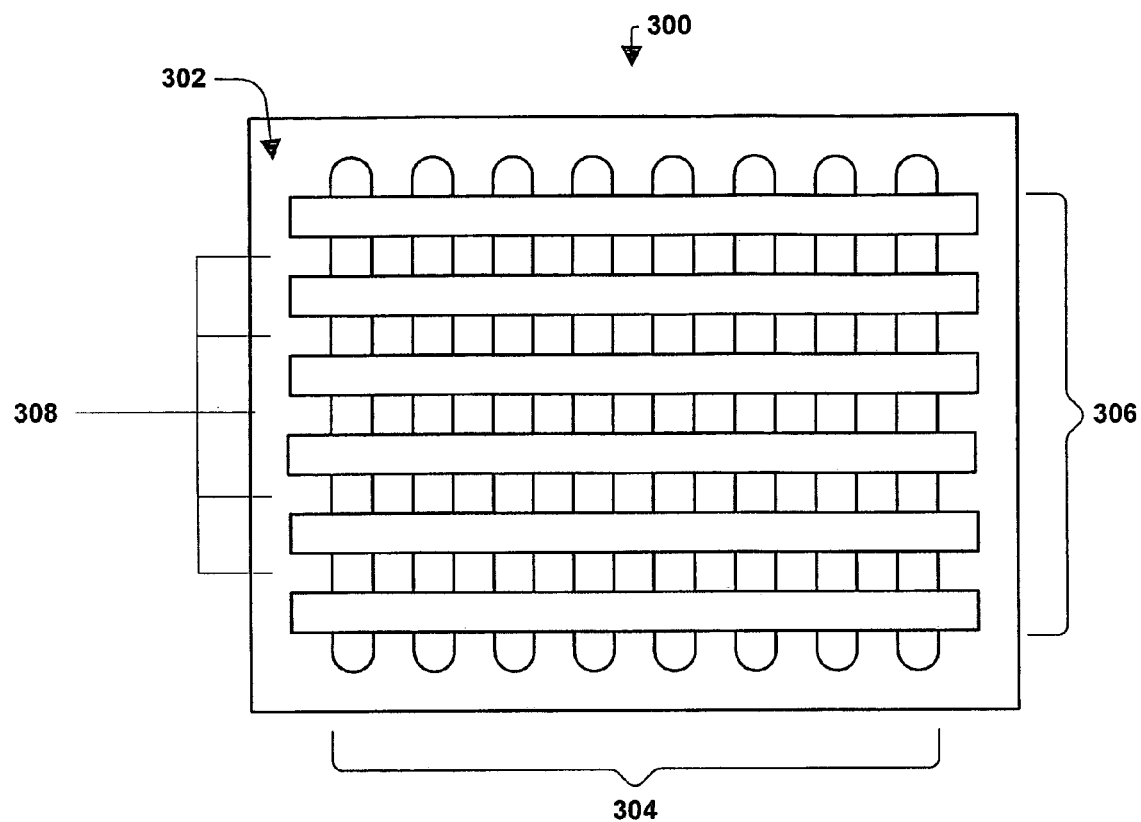
FIG. 3 is a top view of at least a portion of a memory core, such as may include at least part of one of the cores depicted in FIG. 1 in accordance with an aspect of the subject invention.

FIG. 3 is a representation of a portion 300 of an exemplary memory core such as may include at least part of one of the M by N array cores 104 depicted in FIG. 1. The memory core 300 is formed on a semiconductor substrate 302. A plurality of parallel bitlines 304 and parallel wordlines 306 are formed thereon such that the bitlines 304 and wordlines 306 are arranged in a perpendicular fashion. The wordlines 306 are located over the bitlines 304 and are separated by a dielectric stack and charge storage layer (not shown). Bitlines 304 and wordlines 306 also have connections to control circuitry and interconnections as is necessary for the device. Wordline spaces 308 are formed from the area between parallel wordlines 306.

Those skilled in the art will recognize that semiconductor devices may contain multiple device layers. Dielectrics, wordlines, bitlines and other conductive conduits may be formed over other device layers comprising transistors, capacitors, and other functional elements, and likewise, additional device layers may be formed over the depicted memory device 100.

Figure 4:
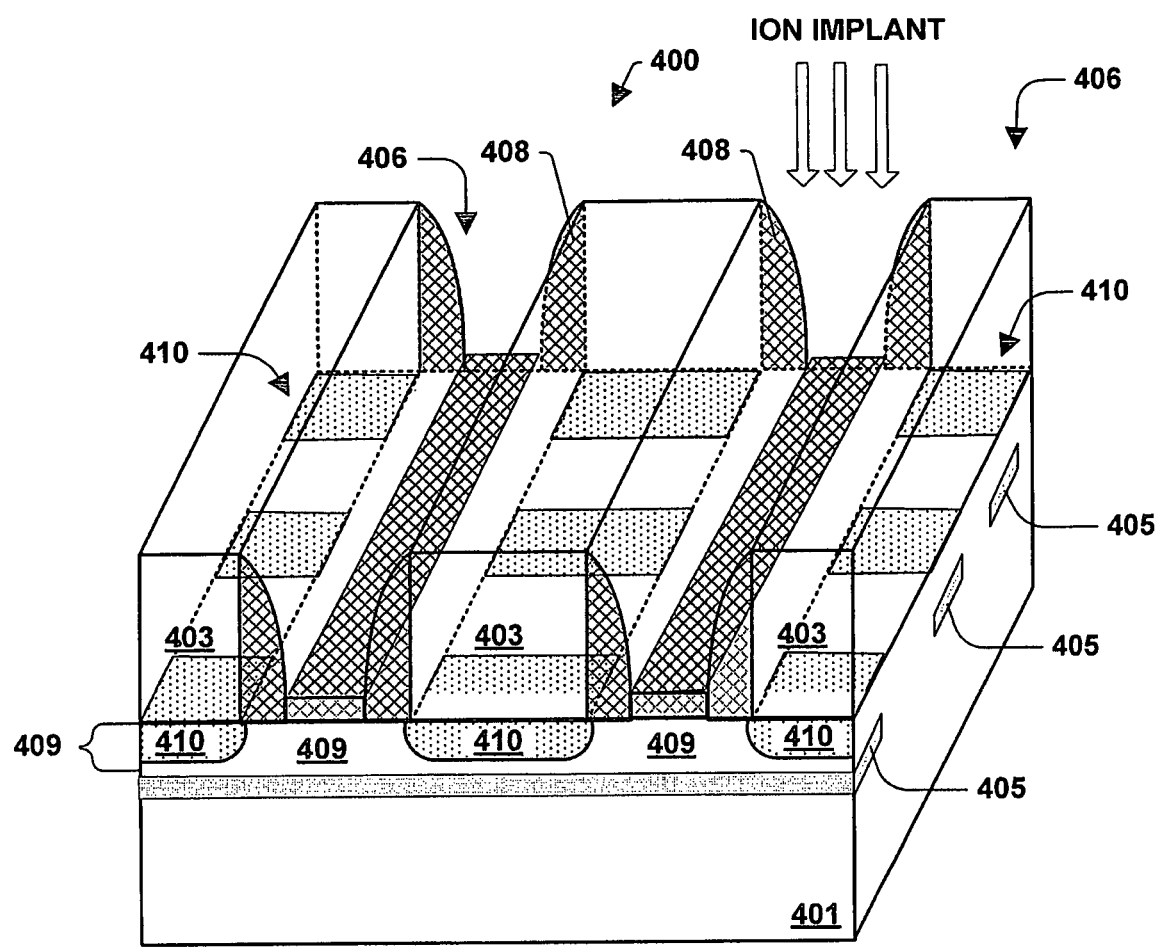
FIG. 4 is a cross-sectional illustration of exemplary memory cells in accordance with an aspect of the subject invention.

FIG. 4 depicts a cross-sectional view of an additional exemplary memory device 400 in accordance with one aspect of the invention. The precise nature and fabrication of the semiconductor device are not critical to the present innovation as the methods disclosed herein are applicable to any semiconductor device. Wordlines 403 are shown formed over a semiconductor substrate 401. Each bitline element 405 shown in FIG. 4 may, in typical devices found in the art, comprise two or more separate bitlines, each of which is associated with one column of an M×N array of memory cells. The wordlines 403 are connected to the control gate electrodes of the device transistors formed at the intersections of the wordlines 403 and bitlines 405. The wordlines 403 are separated by wordline spaces 406 that optionally have a wordline liner 408. The wordlines 403 pass over the charge storage layer 409. Only certain regions of charge storage layer 409 will actually store a charge in a programmed cell 410 (shown as a dot pattern).

In a typical memory device, the bitlines 405 are formed by ion implantation directly into the semiconductor substrate 401. In one embodiment of a memory array, each transistor comprising the memory array may be associated with at least two bitlines, where one bitline serve as a source and the other bitline serves as a drain and a transistor channel (not shown) is formed between the two bitlines. In another embodiment of a memory array, each transistor comprising the array is associated with two bitlines where each bitline may be associated with more than one transistor. In one embodiment of a memory device, the wordlines 403 are formed by forming a layer of polysilicon over the charge storage layer and patterning the polysilicon via lithography, etching the polysilicon to form wordlines, and doping the polysilicon to make the wordlines 403 conductive. Bitlines 405, shown in FIG. 4, represent all bitlines associated with a column of a memory array. Specifically, each bitline 405, shown in FIG. 4, may comprise a separate source bitline and drain bitline.

The charge storage layer 409 is comprised of a charge-trapping dielectric. In one embodiment, the charge-trapping dielectric has three separate layers (not shown): a charge-trapping layer and two insulation layers sandwiching the charge-trapping layer. Specific examples of charge storage layer materials include an oxide/nitride/oxide tri-layer, an oxide/nitride bi-layer, a nitride/oxide bi-layer, an oxide/tantalum oxide bi-layer ($SiO_2/Ta_2O_5$), an oxide/tantalum oxide/oxide tri-layer ($SiO_2/Ta_2O_5/SiO_2$), an oxide/strontium titanate bi-layer ($SiO_2/SrTiO_3$), an oxide/barium strontium titanate bi-layer ($SiO_2/BaSrTiO_2$), an oxide/strontium titanate/oxide tri-layer ($SiO_2/SrTiO_3/SiO_2$), an oxide/strontium titanate/barium strontium titanate tri-layer ($SiO_2/SrTiO_3/BaSrTiO_2$), and the like. The precise nature of the charge storage layer material is not critical to the innovation disclosed herein. Alternatively, the charge storage layer 409 is polysilicon and the memory cell is a dual poly memory cell.

The ion implant is done according to any of the embodiments described above and results in boron atoms, indium atoms or both being embedded into the floor of the wordline space 406 (shown in a hatched pattern). In one embodiment, the ion implant is performed before formation of wordline liner 408. In another embodiment, the ion implant is performed after the wordline liner 408 is formed. In yet another embodiment, the ion implant is performed after patterning the transistor gate electrodes.

Figure 5:
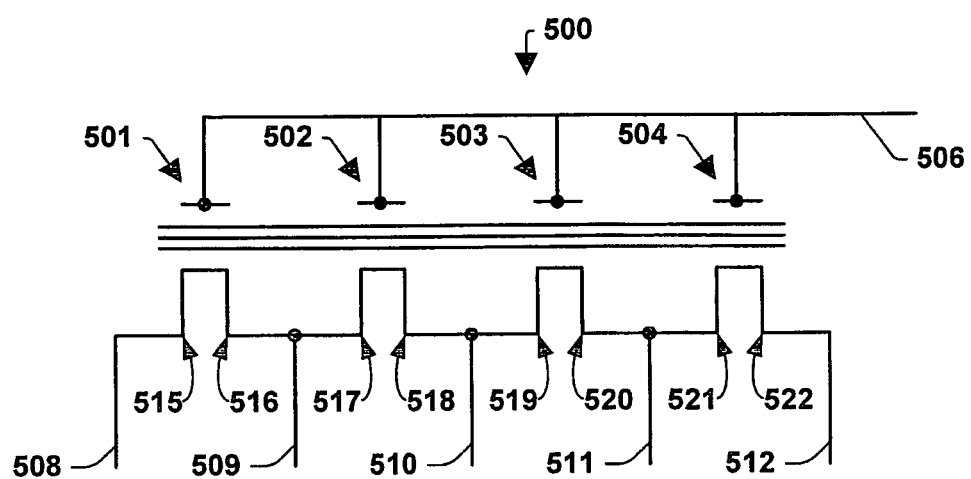
FIG. 5 is a schematic illustration of a portion of a memory core such as may include at least part of one of the cores depicted in FIG. 1 in a virtual ground type configuration in accordance with an aspect of the subject invention.

FIG. 5 shows a circuit schematic of an embodiment of a memory device employing dual bit memory cells. Dual bit memory is a relatively modern memory technology and allows multiple bits to be stored in a single memory cell. The dual bit memory cell is essentially split into two identical (mirrored) parts, each of which is formulated for storing one of two independent bits. Dual bit memory cells are also known in the art as MirrorBit technology. Each dual bit memory cell, like a traditional memory cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit storage of two bits. Those skilled in the art will readily understand that the innovations disclosed herein are applicable to arrays of memory cells capable of storing multiple bits per cell. Although not shown, quad-bit memory cells can be employed.

The circuit schematic, FIG. 5, shows a line of memory cells, which includes memory cells 501 through 504 in a virtual ground type implementation, for example. The respective memory cells 501 through 504 are connected to a wordline 506, which serves as a control gate, and pairs of the memory cells share a common bitline. For instance, in the example shown, the memory cell 501 is associated with bitlines 508 and 509; the memory cell 502 is associated with bitlines 509 and 510; the memory cell 503 is associated with bitlines 510 and 511; and the memory cell 504 is associated with bitlines 511 and 512. As such, cells 501 and 502 share bitline 509, cells 502 and 503 share bitline 510 and cells 503 and 504 share bitline 511, respectively.

Depending upon a signal on the wordline and the connection of the bitlines in a memory cell to an electrical source or drain, the memory cells 501 through 504 are capable of writing, reading, and erasing bits at locations 515 through 522. For example, control of the bit at location 515 is achieved through connection of the drain to the bitline 508 and the source to the bitline 509. Similarly, control of the bit at location 516 is achieved through connection of the drain to the bitline 509 and the source to the bitline 508. Reading of a cell is performed by switching the role of the bitlines compared to programming so that current flows through the memory cell in the opposite direction.

Figure 6:
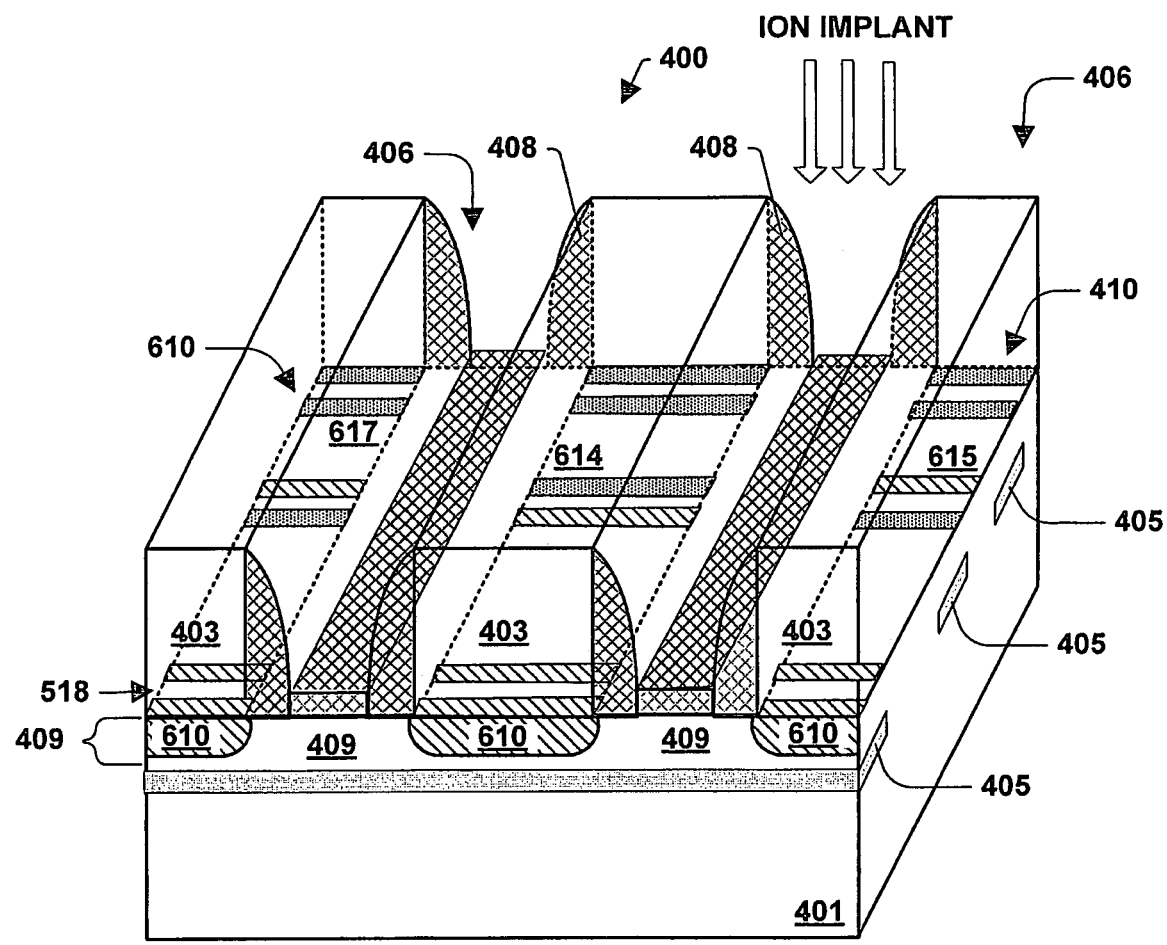
FIG. 6 is a top view of at least a portion of a memory core, such as may include at least part of one of the cores depicted in FIG. 1 in accordance with an aspect of the subject invention.
Figure 7:
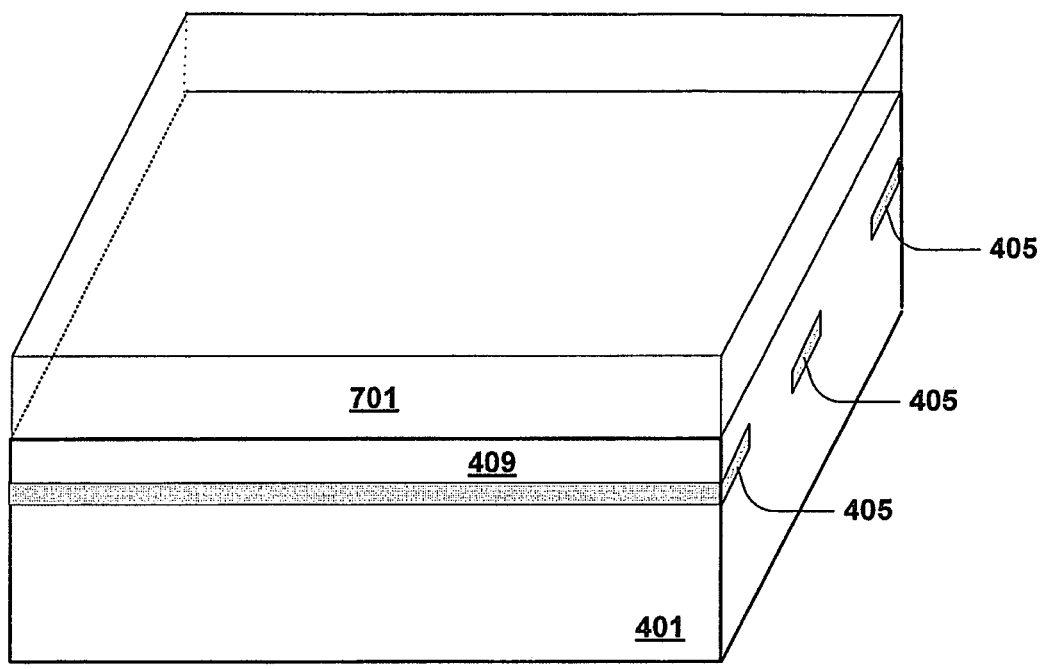
FIG. 7 is a view of a structure useful in fabricating a memory core in accordance with an aspect of the invention.

FIG. 6 shows an embodiment of a memory device according to aspects of the invention with dual bit memory cells. Reference numerals in FIG. 6 have the same meaning as in FIG. 4. The regions of charge storage layer 409 that may hold a charge 610 are spit into two mirror images per memory cell. A memory cell having one programmed bit is shown as reference number 614, where the programmed bit portion of charge storage layer 409 is shown in a dot pattern and the uncharged portion is shown in a stripe pattern. Each memory cell or transistor at the intersection of bitlines 405 and wordlines 403 is capable of storing two bits independently. That is, a read out of memory cell 614 is different from a read out of memory cell 615 due to spatial differences in storage of a first charge level. A memory cell having two programmed bits is shown as reference number 617 and a memory cell having no programmed bits is shown as reference number 618.

A dual bit memory cell can have a semiconductor substrate with implanted conductive bit lines. A charge storage layer can contain one or more layers and can be formed over the semiconductor substrate. For example, the charge storage layer can contain three separate layers: a first insulating layer, a charge storage dielectric layer, and a second insulating layer. Word lines are formed over the charge storage layer substantially perpendicular to the bit lines. Programming circuitry controls two bits per cell by applying a signal to the word line, which acts as a control gate, and changing bit line connections such that one bit is stored by source and drain being connected in one arrangement and a complementary bit is stored by the source and drain being interchanged in another arrangement.

To better describe the implementation of aspects of the invention, the fabrication of an example semiconductor device will be described. Those skilled in the art will recognize that well-known semiconductor fabrication techniques include depositing semiconductor material, masking, photolithography, etching, and implanting are useful in forming the described devices. Deposition of semiconductor materials may be by low pressure chemical vapor deposition, chemical vapor deposition, atomic layer deposition, and the like. Conserved reference numbers match like elements in FIGS. 4, 6, 7, and 8. The charge storage layer 409 is deposited over semiconductor substrate 401. Semiconductor substrate 401 is doped to be a p-type material in a typical device. Then, the bitlines 405 are formed by ion implantation under the charge storage layer 409. The bitlines are formed by implantation of an n-type dopant in a typical device. Then, a layer of polysilicon 701 is deposited over the charge storage layer 409, which is formed into the wordlines.

A photoresist (not shown) is formed over the polysilicon layer 701, and wordlines 403 are formed using conventional photolithography and etching techniques. At this point, the implantation in the wordline space 406 of boron, indium, or a combination of boron and indium in accordance with the concentration and energy levels disclosed supra may be performed.

Figure 8:
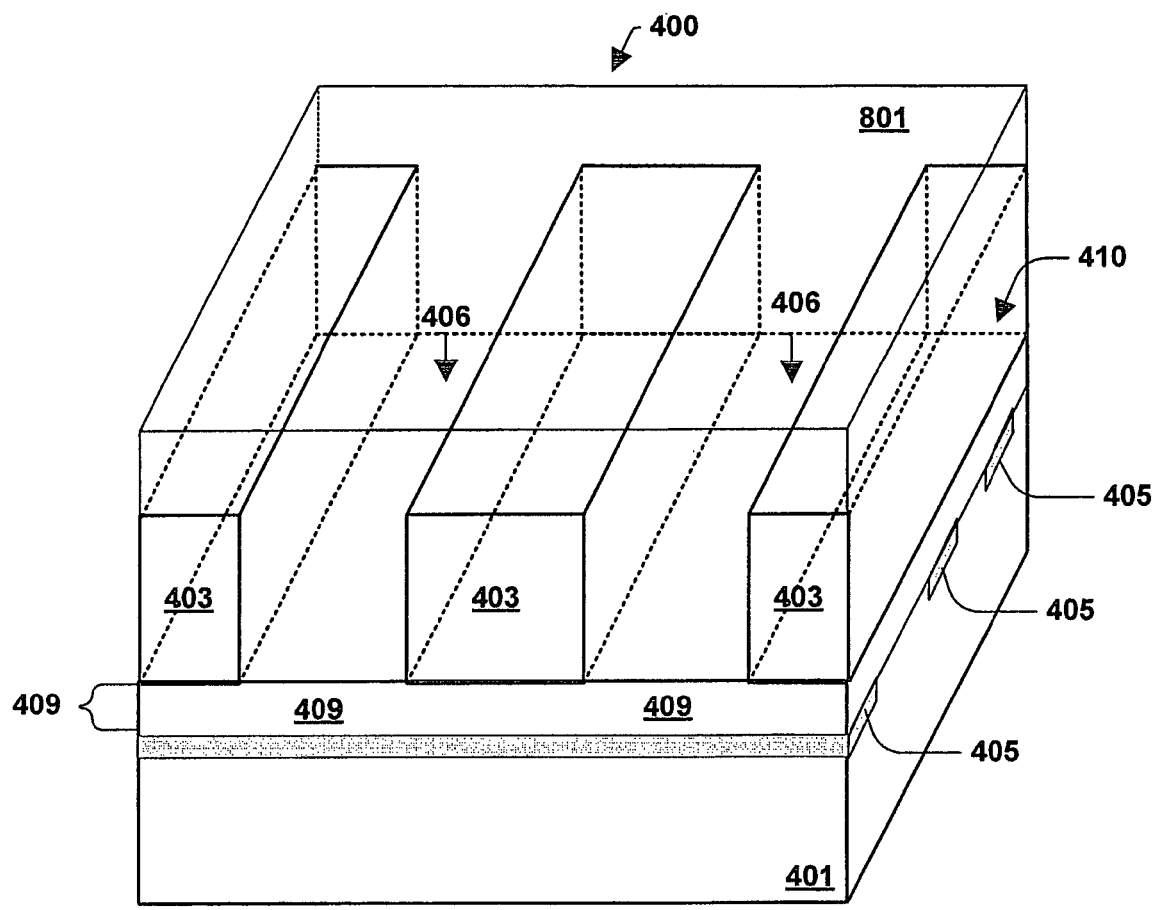
FIG. 8 is a view of a structure useful in fabricating a memory core in accordance with an aspect of the invention.

Referring to FIG. 8, wordline liner 408 is formed by placing a layer of doped polysilicon 801 over the wordlines 403 such that the doped polysilicon is present above the wordlines 407 and within the wordline spaces 406. The devices shown in FIGS. 4 and 6 are then formed by etching techniques. At this point, the implantation in the wordline space 406 of boron, indium, or a combination of boron and indium in accordance with the concentration and energy levels disclosed supra may be performed. Those skilled in the art will readily understand that memory devices may be fabricated using silicon nitride and other materials as a wordline liner or spacer 408. Functional devices may also be constructed without use of any liner or spacer within the wordline spaces 406.

Figure 9:
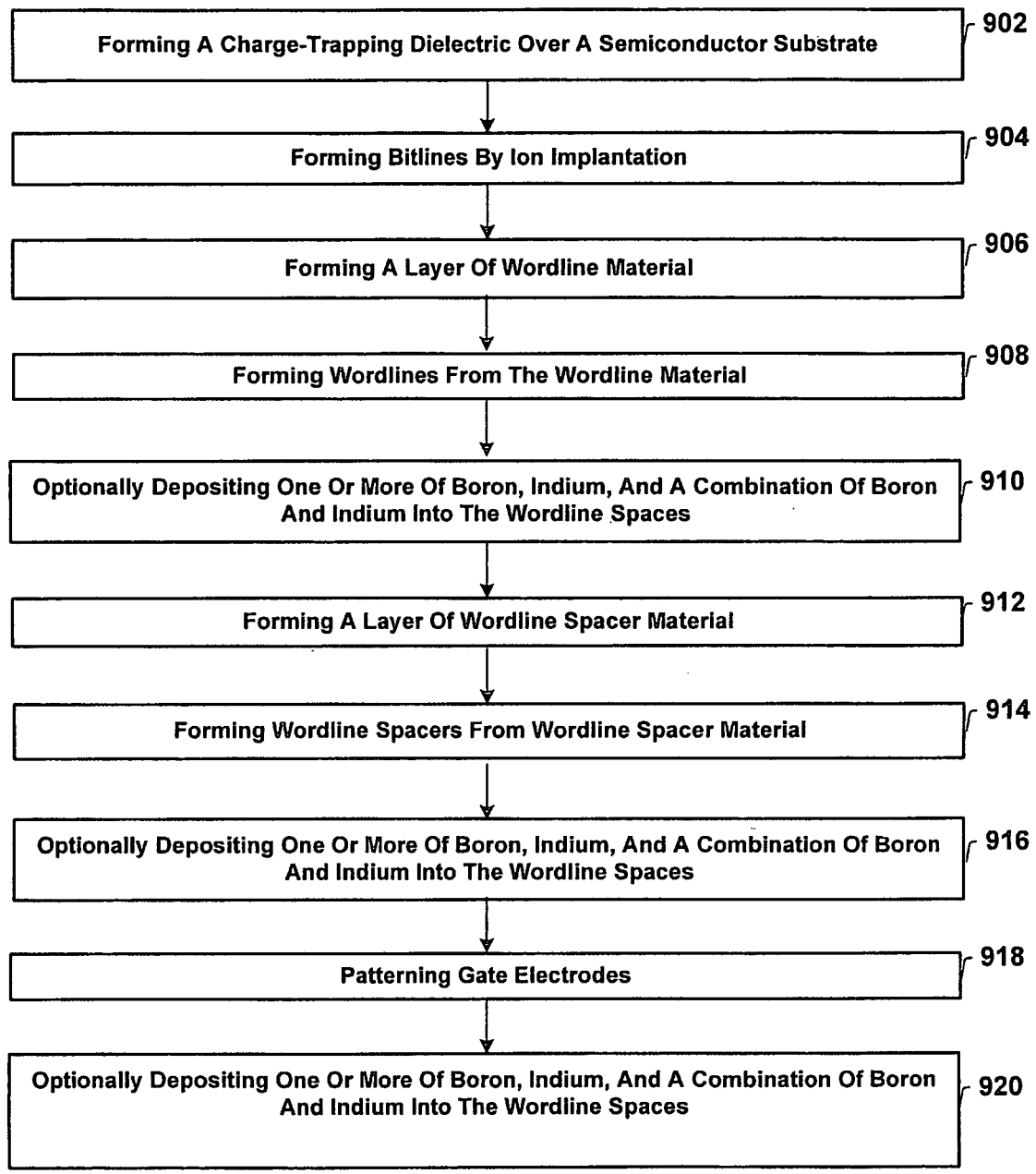
FIG. 9 illustrates an exemplary methodology of forming a memory core in accordance with an aspect of the subject invention.

Referring to FIG. 9, a process chart of embodiments of the present invention is presented. In step 902, a charge-trapping dielectric is formed over a semiconductor substrate. In step 904, bit lines are formed by ion implantation. In step 906, a layer of wordline material is formed over the semiconductor substrate. In step 908, wordlines are formed by standard photolithography and etching techniques or other appropriate means. In step 910, the deposition of one or more of boron, indium or a combination of boron into the wordline spaces is optionally performed in accordance with any of the aspects of the invention described above. In step 912, a layer of wordline spacer material is formed over the wordlines. In step 914, wordline spacers are formed from the layer of wordline layer material by any appropriate means. In step 916, the deposition of one or more of boron, indium or a combination of boron into the wordline spaces is optionally performed in accordance with any of the aspects of the invention described above. In step 918, gate electrodes are patterned in accordance with methods well-known in the art. In step 920, the deposition of one or more of boron, indium or a combination of boron into the wordline spaces is optionally performed in accordance with any of the aspects of the invention described above. In some embodiments, it may be advantageous to perform an annealing step after the performance of any ion implant to rectify damage done to surrounding structures during the implant and to reduce transient diffusion on implanted boron and/or indium during later processing steps. In one embodiment, a rapid thermal anneal according to methods well-known in the art is performed.

The methods discussed above are illustrative of typical steps formed in the production of memory devices. Those skilled in the art will readily understand that additional steps are performed in fabricating memory devices known in the art and that the above steps 902 through 920 may be modified in accordance with techniques well-known in the art.

Figure 10:
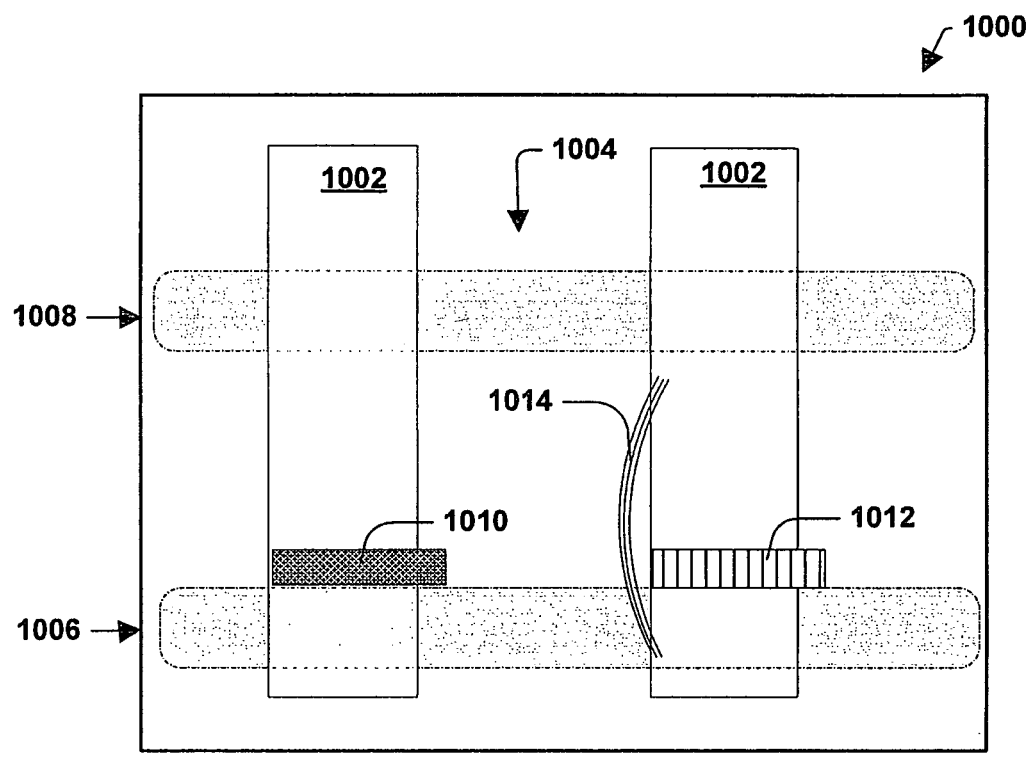
FIG. 10 illustrates a prior art memory device having a parasitic current.

FIG. 10 (prior art) shows an above view of a memory device 1000. Wordlines 1002 are shown separated by wordline spaces 1004. Each memory cell comprises a source bitline 1006 and a drain bitline 1008. A charge storage layer is located between the wordlines 1002 and the bitlines 1008/1006. A programmed memory cell has a region of the charge storage layer having a negative charge 1010 in a portion of the charge storage layer, while an unprogrammed memory cell has no charge 1012 in an analogous portion. A current 1014 flowing along a wordline adjacent to a programmed cell is disturbed in the region close to the programmed storage layer 1010. Specifically, a parasitic current flows along the edge of the wordline 1002 and may flow into the wordline space 1004. This parasitic current is the source of AWD in memory devices.

Figure 11:
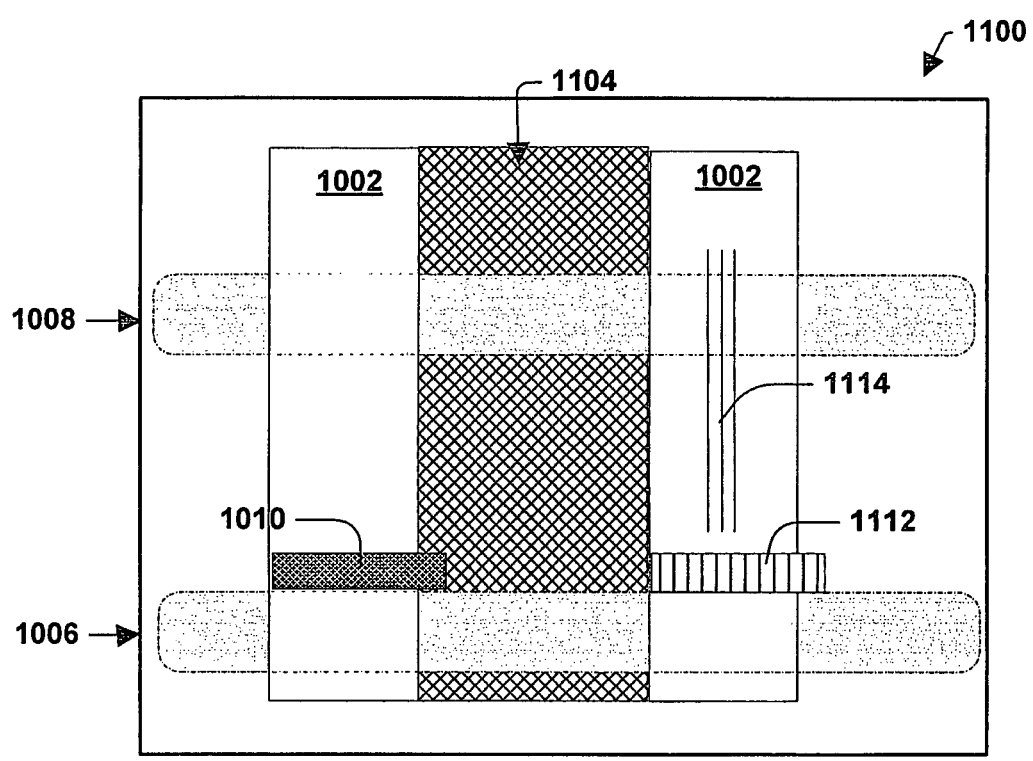
FIG. 11 illustrates a memory device in accordance with an aspect of the invention having reduced parasitic current.

The benefit achieved from the present innovation is shown in FIG. 11. FIG. 11 is similar to FIG. 10 except an ion implant of boron, indium or indium and boron has been performed to implant atoms within the wordline space 1104. As shown, the parasitic current is eliminated and current 1114 flows toward the center of wordline 1002. In one embodiment, the threshold voltages of wordlines adjacent to programmed memory cell or cells are about the same as the threshold voltage of wordlines not adjacent to programmed memory cells. In another embodiment, the threshold voltages of wordlines adjacent to a programmed memory cell or cells is within about 5% of the threshold voltage of wordlines not adjacent to programmed memory cells. In yet another embodiment, the threshold voltages of wordlines adjacent to a programmed memory cell or cells is within about 2% of the threshold voltage of wordlines not adjacent to programmed memory cells.

The resultant semiconductor structures formed herein are useful in any electronic device such as a memory. For example, the resultant semiconductor structure is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A semiconductor device comprising:
   a semiconductor substrate;
   two or more parallel bitlines formed within the semiconductor substrate;
   a charge storage layer capable of storing a negative charge formed over the semiconductor substrate and the two or more parallel bitlines;
   two or more parallel wordlines formed over the charge storage layer, the semiconductor substrate and the two or more parallel bitlines, the two or more parallel wordlines being perpendicular to the two or more parallel bitlines;
   one or more wordline spaces comprising the area between the two or more parallel wordlines; and
   an implant comprising at least one of boron, indium, and a combination thereof embedded into the floor of at least one space of the one or more wordline spaces, wherein the implant forms an implant region which is adjacent the two or more parallel wordlines and located over the charge storage layer and the semiconductor substrate.

2. The semiconductor device of claim 1, wherein the semiconductor device comprises an array of memory cells formed at areas where the two or more parallel bitlines and the two or more parallel wordlines intersect, wherein the one or more wordline spaces comprise the area between the memory cells.

3. The semiconductor device of claim 2, wherein the threshold voltages of wordlines adjacent to a programmed memory cell or cells are about the same as the threshold voltage of wordlines not adjacent to programmed memory cells.

4. The semiconductor device of claim 1, wherein the implant has a projected range from about 10 to about 200 nm.

5. The semiconductor device of claim 1, wherein the implant has a projected range from about 20 to about 2000 nm.

6. The semiconductor device of claim 1, wherein the semiconductor device is one or more of electrically programmable ROM, electrically erasable PROM, and FLASH memory.

7. The semiconductor device of claim 2, wherein the array of memory cells comprise one or more selected from dual poly flash memory cells and dielectric charge storage memory cells.

8. The semiconductor device of claim 1, where in the charge storage layer comprises one or more of an oxide/nitride/oxide tri-layer, an oxide/nitride bi-layer, a nitride/oxide bi-layer, an oxide/tantalum oxide bi-layer ($SiO_2/Ta_2O_5$), an oxide/tantalum oxide/oxide tri-layer ($SiO_2/Ta_2O_5/SiO_2$), an oxide/strontium titanate bi-layer ($SiO_2/SrTiO_3$), an oxide/barium strontium titanate bi-layer ($SiO_2/BaSrTiO_2$), an oxide/strontium titanate/oxide tri-layer (SiO$_2$/SrTiO$_3$/SiO$_2$), and an oxide/strontium titanate/barium strontium titanate tri-layer (SiO$_2$/SrTiO$_3$/BaSrTiO$_2$).

9. The semiconductor device of claim 1, wherein the concentration of the implant is from about 10$^{16}$ to about 10$^{19}$ atoms/cm$^3$ of one or more of boron, indium, and a combination of boron and indium.

10. The semiconductor device of claim 1, further comprising:
a liner formed adjacent sidewalls of the wordline in the one or more wordline spaces, wherein the implant is embedded into the charge storage layer between the liner.

11. The semiconductor device of claim 1, wherein a width of the one or more wordline spaces is less than about 10 μm, and wherein the one or more wordline spaces comprise the area between the two or more parallel wordlines above the two or more parallel bitlines.

12. The semiconductor device of claim 1, wherein the implant comprises a combination of boron and indium.

13. The semiconductor device of claim 1, wherein the implant region is contained within the one or more wordline spaces.

14. A semiconductor device comprising:
two or more parallel bitlines formed within a semiconductor substrate;
a charge storage layer capable of storing a negative charge formed over the semiconductor substrate and the two or more parallel bitlines;
two or more parallel wordlines formed over the charge storage layer, the semiconductor substrate and the two or more parallel bitlines, the two or more parallel wordlines being perpendicular to the two or more parallel bitlines;
one or more wordline spaces comprising the area between the two or more parallel wordlines; and
an implant comprising indium embedded in the floor of at least one space of the one or more wordline spaces, wherein the implant forms an implant region which is adjacent the two or more parallel wordlines and located over the charge storage layer and the semiconductor substrate.

15. The semiconductor device of claim 14, wherein the semiconductor device comprises an array of memory cells formed at areas where the two or more parallel bitlines and the two or more parallel wordlines intersect, wherein the one or more wordline spaces comprise the area between the memory cells.

16. The semiconductor device of claim 15, wherein the threshold voltages of wordlines adjacent to a programmed memory cell or cells are about the same as the threshold voltage of wordlines not adjacent to programmed memory cells.

17. The semiconductor device of claim 14, where in the charge storage layer comprises one or more of an oxide/nitride/oxide tri-layer, an oxide/nitride bi-layer, a nitride/oxide bi-layer, an oxide/tantalum oxide bi-layer (SiO$_2$/Ta$_2$O$_5$), an oxide/tantalum oxide/oxide tri-layer (SiO$_2$/Ta$_2$O$_5$/SiO$_2$), an oxide/strontium titanate bi-layer (SiO$_2$/SrTiO$_3$), an oxide/barium strontium titanate bi-layer (SiO$_2$/BaSrTiO$_2$), an oxide/strontium titanate/oxide tri-layer (SiO$_2$/SrTiO$_3$/SiO$_2$), and an oxide/strontium titanate/barium strontium titanate tri-layer (SiO$_2$/SrTiO$_3$/BaSrTiO$_2$).

18. The semiconductor device of claim 14, wherein the concentration of the implant is from about 10$^{16}$ to about 10$^{19}$ atoms/cm$^3$ of one or more of boron, indium, and a combination of boron and indium.

19. The semiconductor device of claim 14, further comprising:
a liner formed adjacent sidewalls of the wordline in the one or more wordline spaces, wherein the implant is embedded into the charge storage layer between the liner.

20. The semiconductor device of claim 14, wherein a width of the one or more spaces is less than about 10 μm, and wherein the one or more wordline spaces comprise the area between the two or more parallel wordlines above the two or more parallel bitlines.

* * * * *